(12) United States Patent
Lin (10) Patent No.: US 11,812,570 B1
(45) Date of Patent: Nov. 7, 2023

(54) FPC/FFC TENSION KEEPING DEVICE AND ELECTRONIC DEVICE

(71) Applicant: FOSITEK CORPORATION, New Taipei (TW)

(72) Inventor: Wen-Yen Lin, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 17/945,374

(22) Filed: Sep. 15, 2022

(30) Foreign Application Priority Data

Jun. 29, 2022 (TW) .................................. 111124223

(51) Int. Cl.
*H05K 5/02* (2006.01)
*H05K 1/18* (2006.01)
*G06F 1/16* (2006.01)

(52) U.S. Cl.
CPC ......... *H05K 5/0226* (2013.01); *G06F 1/1652* (2013.01); *H05K 1/189* (2013.01)

(58) Field of Classification Search
None
See application file for complete search history.

(56) References Cited

U.S. PATENT DOCUMENTS

| | | | | |
|---|---|---|---|---|
| 5,758,208 A | * | 5/1998 | Fujii ........................ | G03B 5/00 396/542 |
| 6,057,179 A | * | 5/2000 | Lin ........................ | H01L 21/565 438/126 |
| 2014/0029217 A1 | * | 1/2014 | Nishihara ............ | H05K 1/0271 361/752 |
| 2016/0344118 A1 | * | 11/2016 | Hsieh ..................... | H01R 12/73 |
| 2016/0380372 A1 | * | 12/2016 | Hsieh ..................... | H01R 24/60 439/676 |
| 2017/0129738 A1 | * | 5/2017 | Chen ................... | B65H 75/4471 |
| 2017/0275133 A1 | * | 9/2017 | Chen .................... | B65H 75/486 |

FOREIGN PATENT DOCUMENTS

CN 103687361 3/2014

OTHER PUBLICATIONS

Search Report appended to an Office Action, which was issued to Taiwanese counterpart application No. 111124223 by the TIPO dated Apr. 11, 2023, and English translation thereof, 2 pages.

* cited by examiner

*Primary Examiner* — Fred Tzeng
(74) *Attorney, Agent, or Firm* — Burris Law, PLLC (57) ABSTRACT

A flexible circuit tension keeping device mountable on an electronic device includes a base seat having opposite first and second surfaces such that a flexible circuit board is bent to surround the first and second surfaces, at least one sliding member slidably disposed on the base seat in a front-rear direction, and spring members disposed between the base seat and the sliding member. The sliding member has a tense surface which is engaged with the flexible circuit board such that a pulling force generated as a result of rotation of a second device part relative to a first device part of the electronic device is applied to the flexible circuit board to move the tense surface of the sliding member toward the base seat, and the sliding member is biased by the spring members to keep tense of the flexible circuit board.

14 Claims, 8 Drawing Sheets

FPC/FFC TENSION KEEPING DEVICE AND ELECTRONIC DEVICE

CROSS-REFERENCE TO RELATED APPLICATION

This application claims priority of Taiwanese Patent Application No. 111124223, filed on Jun. 29, 2022.

FIELD

The disclosure relates to an electronic device, and more particularly to a flexible circuit tension keeping device.

BACKGROUND

In an electronic device, such as a notebook, the internal circuit of one device part (such as a display screen part) extends to be connected with the other device part (such as a host computer part), and the internal circuit is hence exposed from a gap between the two device parts. For this type of electronic device, a flexible circuit board (also known as a flexible printed circuit board (FPC)) is employed to establish the wiring, which reduces the internal space occupied by the wiring, and a roller shade module is used to cover the gap between the two device parts to conceal the FPC board. The roller shade module is rollable along with the pivot movement of the device parts relative thereto. Thus, the space occupied by a hinge between the two device parts and the thickness of the electronic device are reduced. However, the structure of the roller shade module is relatively complicated and inconvenient to assemble. The roller shade module has a rolling shaft and a rollable shade screen made which must be made from specific materials that may entail higher manufacturing and assembling costs.

SUMMARY

Therefore, an object of the disclosure is to provide a flexible circuit tension keeping device and an electronic device that can alleviate at least one of the drawbacks of the prior art.

According to the disclosure, the flexible circuit tension keeping device is mountable on an electronic device. The electronic device has a first device part, a second device part rotatably connected with the first device part, and at least one flexible circuit board extending between and interconnecting insides of the first and second device parts. The flexible circuit tension keeping device includes a base seat unit including a base seat. The base seat has at least one first surface and at least one second surface opposite to the first surface such that the flexible circuit board is folded to surround the first surface and the second surface. A sliding unit is disposed on the base seat, and includes at least one sliding member which is slidably disposed on the base seat in a front-rear direction and which extends in a left-right direction that is transverse to the front-rear direction, and at least two spring members which are disposed between the base seat and the sliding member. The sliding member has a tense surface which is disposed remote from the base seat and which is engaged with the flexible circuit board such that, a pulling force generated as a result of rotation of the second device part relative to the first device part is applied to the flexible circuit board to move the tense surface of the sliding member toward the base seat, and the sliding member is biased by the spring members to engage with the flexible circuit board and to maintain tension of the flexible circuit board.

According to the disclosure, the electronic device includes a first device part, a second device part rotatably connected with the first device part, at least one flexible circuit board extending between and interconnecting insides of the first and second device parts, and a flexible circuit tension keeping device including a base seat unit and a sliding unit. The base seat unit includes a base seat which has at least one first surface and at least one second surface opposite to the first surface. The flexible circuit board is folded to surround the first surface and the second surface. The sliding unit is disposed on the base seat. The sliding unit includes at least one sliding member which is slidably disposed on the base seat in a front-rear direction and which extends in a left-right direction that is transverse to the front-rear direction, and at least two spring members which are disposed between the base seat and the sliding member. The sliding member has a tense surface which is disposed remote from the base seat and which is engaged with the flexible circuit board such that, a pulling force generated as a result of rotation of the second device part relative to the first device part is applied to the flexible circuit board to move the tense surface of the sliding member toward the base seat, and the sliding member is biased by the spring members to engage with the flexible circuit board and to maintain tension of the flexible circuit board.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
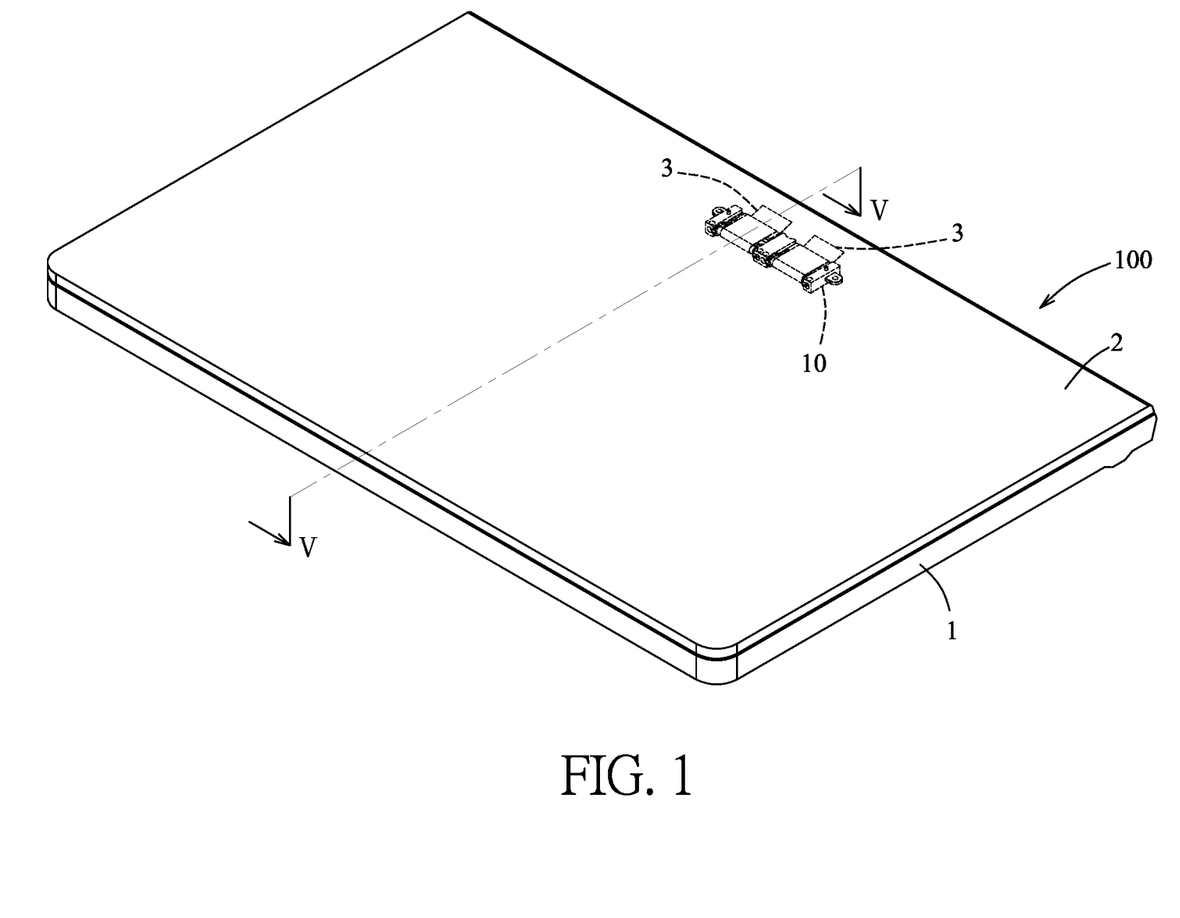
FIG. 1 is a perspective view illustrating an embodiment of an electronic device according to the disclosure.
Figure 2:
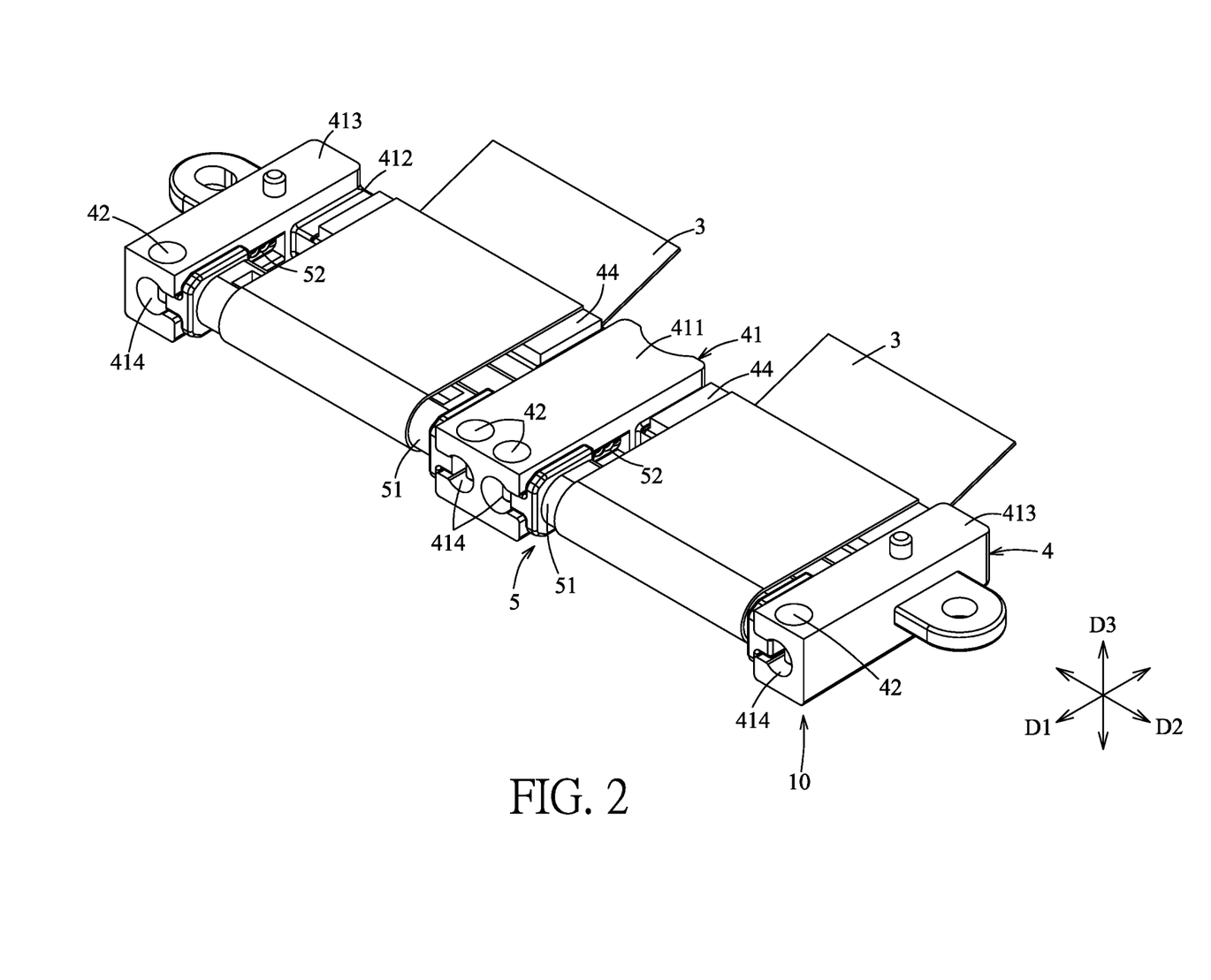
FIG. 2 is a perspective view illustrating an embodiment of a flexible circuit tension keeping device with two flexible circuit boards mounted thereon.
Figure 3:
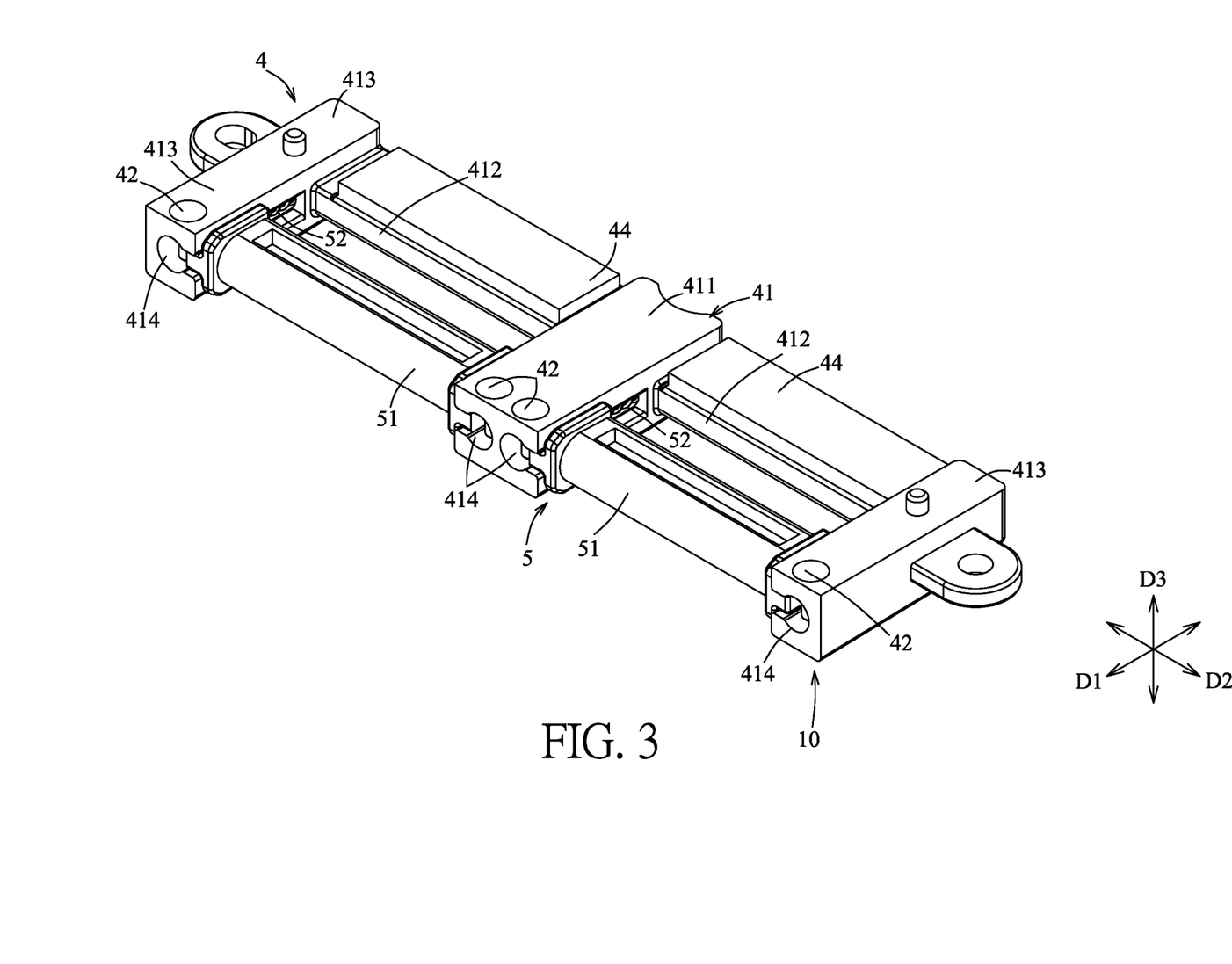
FIG. 3 is a perspective view of the flexible circuit tension keeping device of the embodiment.

Referring to FIGS. 1 to 3, an embodiment of an electronic device 100 according to the disclosure includes a first device part 1, a second device part 2 rotatably connected with the first device part 1, two flexible circuit boards 3 (flexible printed circuit boards or flat flexible cable boards) extending between and interconnecting insides of the first and second device parts 1, 2, and a flexible circuit tension keeping device 10. The electronic device 100 may be a notebook, a foldable phone, a foldable tablet or other foldable electronic device. In various embodiments, the number of flexible circuit boards 3 may be one or more than two.

Figure 5:
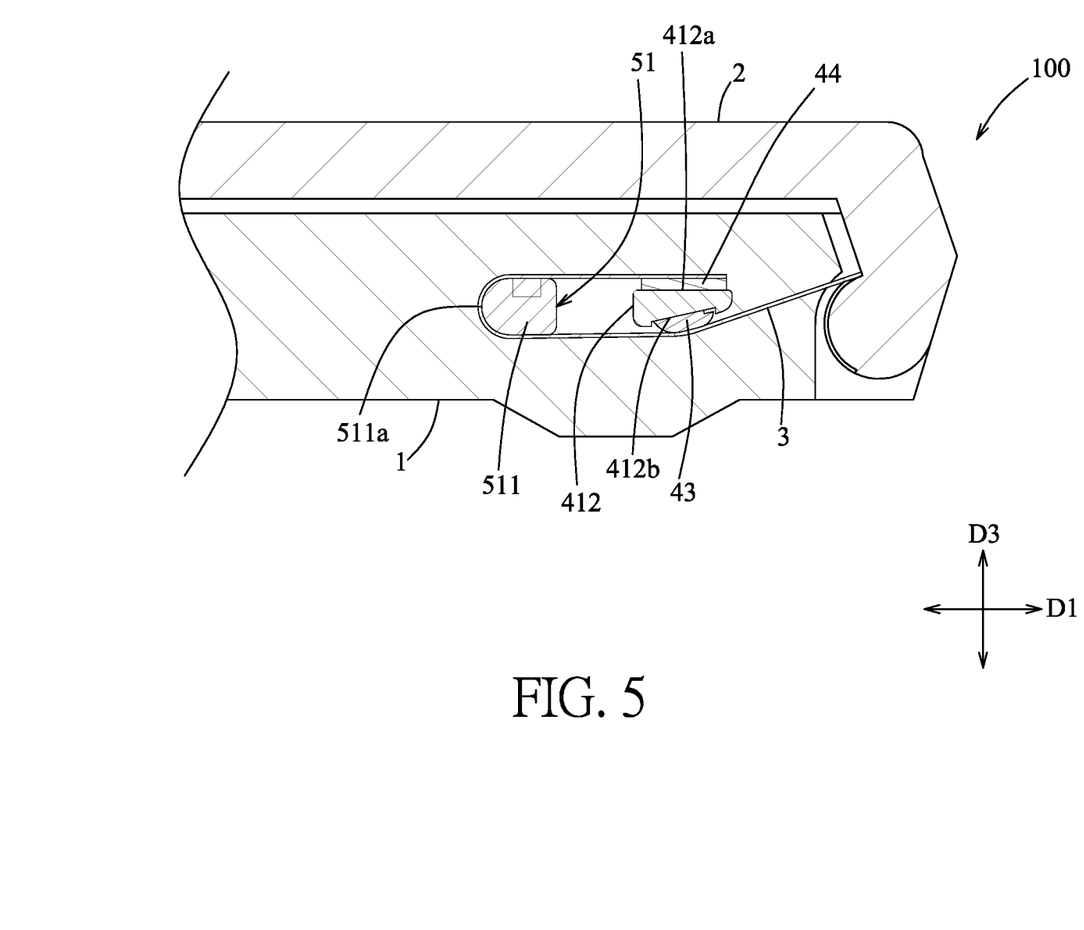
FIG. 5 is a fragmentary sectional view taken along line V-V of FIG. 1, illustrating a state when a second device part is in a folded position.
Figure 6:
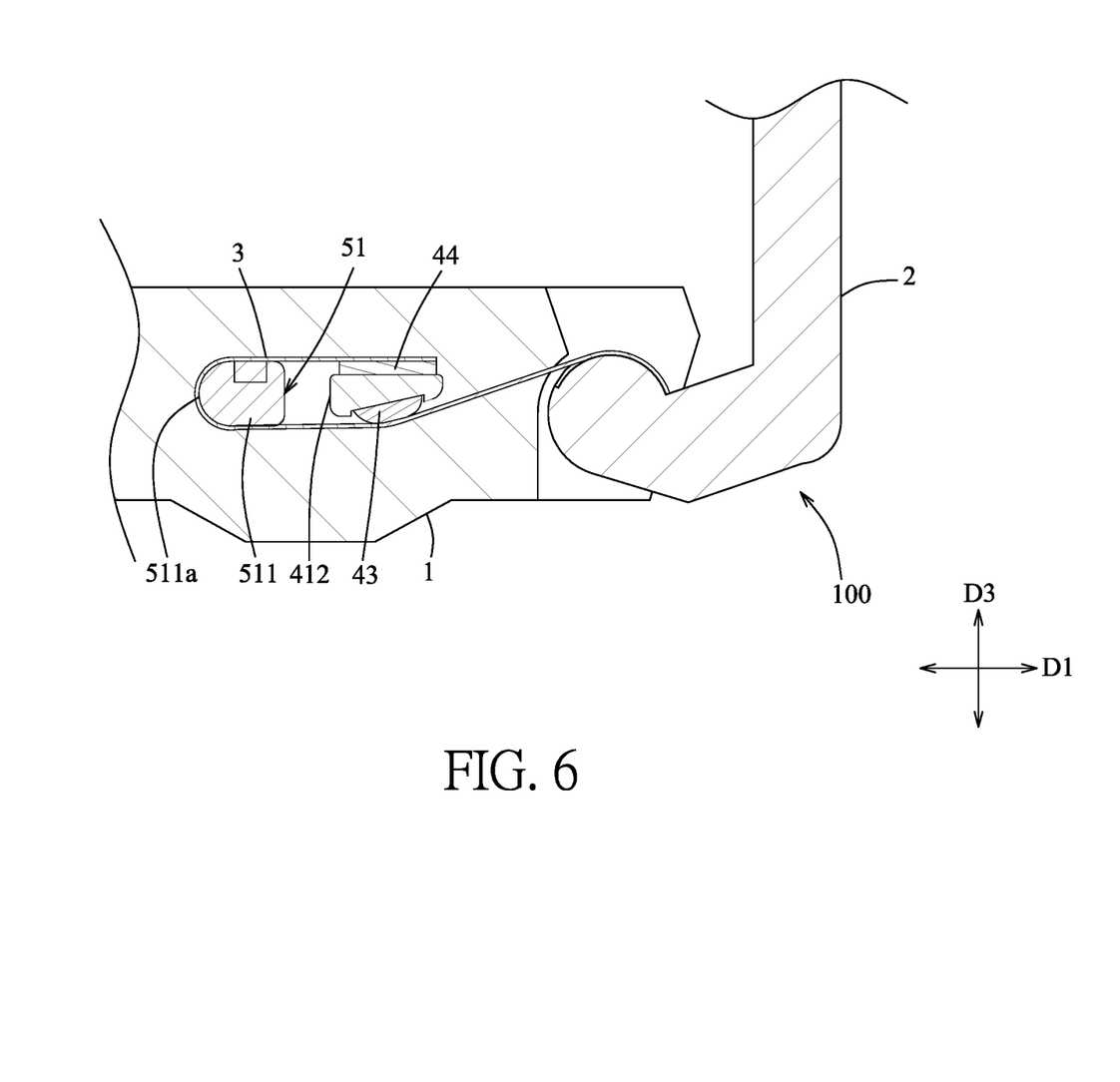
FIG. 6 is a fragmentary sectional view similar to FIG. 5, illustrating a state when the second device part is rotated between the folded position and an unfolded position.
Figure 7:
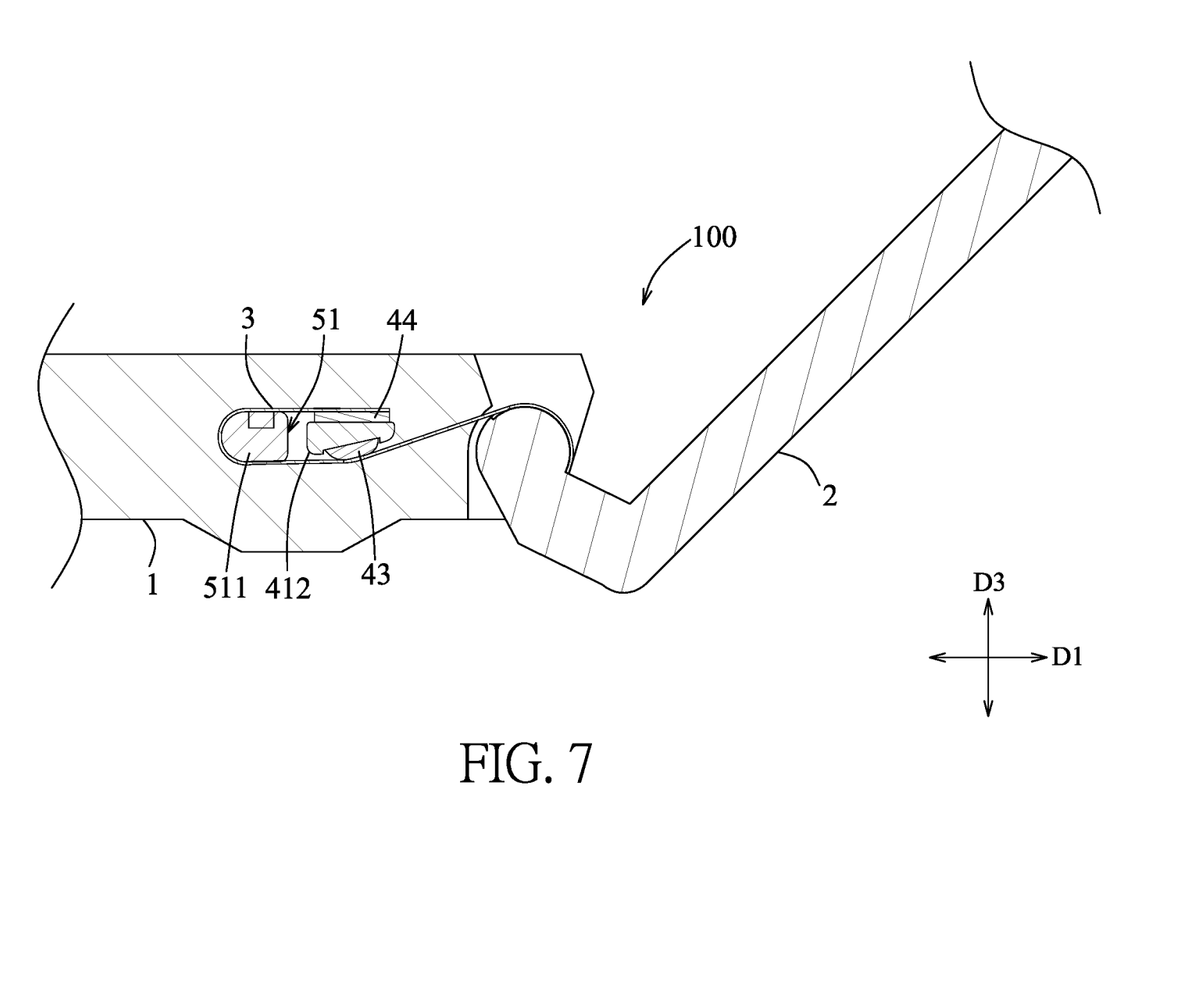
FIG. 7 is a fragmentary sectional view similar to FIG. 5, illustrating a state when the second device part is in the unfolded position.

In this embodiment, the electronic device 100 is a notebook, and the first device part 1 is a host computer and keyboard part and the second device part 2 is a display screen part. The second device part 2 is rotatable relative to the first device part 1 between a folded position (see FIG. 5) and an unfolded position (see FIG. 7). For example, the second device part 2 is rotatably connected with the first device part 1 through a hinge (not shown).

The flexible circuit boards 3 extend between and interconnect insides of the first and second device parts 1, 2 to be mechanically and electronically connected with electronic elements inside of the first and second device parts 1, 2. Through the thin and flat flexible circuit boards 3 establishing the wiring, space is saved in the electronic device 100.

Figure 4:
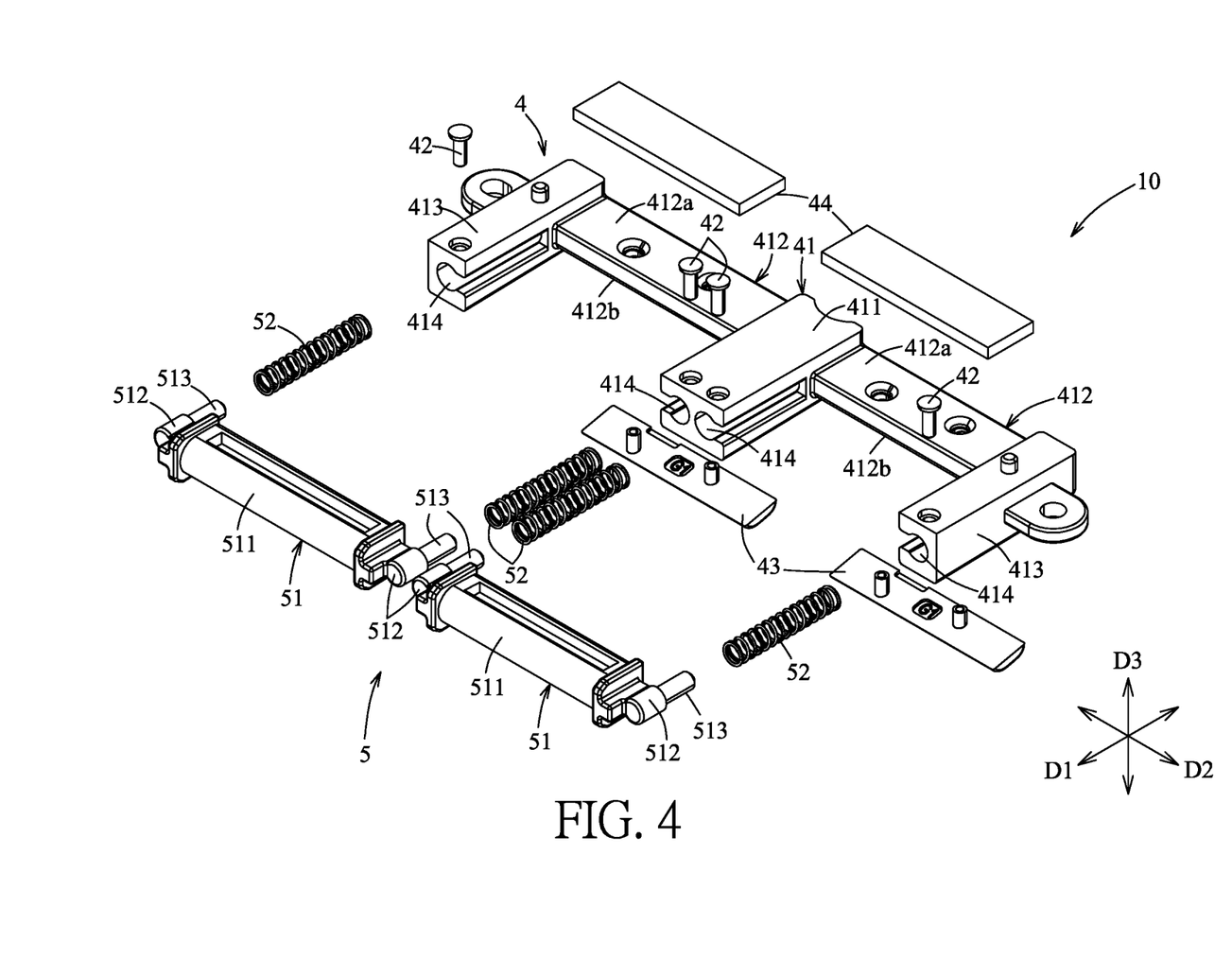
FIG. 4 is an exploded perspective view of the flexible circuit tension keeping device of the embodiment.

With reference to FIGS. 2 to 4, the flexible circuit tension keeping device 10 includes a base seat unit 4 and a sliding unit 5. The base seat unit 4 includes a base seat 41, four stop members 42 disposed on the base seat 41, two wear-resistant sheets 43 disposed on the base seat 41 and respectively engaged with the flexible circuit boards 3, and two cushion pads 44 disposed on the base seat 41 and respectively in contact with the flexible circuit boards 3. The base seat 41 has a central body 411 extending in a front-rear direction (D1), two connecting plates 412 extending from the central body 411 in a left-right direction (D2) that is transverse to the front-rear direction (D1) and away from each other, and two lateral bodies 413 respectively connected with the connecting plates 412 to be disposed laterally of and spaced apart from the central body 411. The base seat 41 has four sliding slots 414 each extending in the front-rear direction (D1). Two sliding slots 414 are formed in the central body 411, and the other two sliding slots 414 are respectively formed in the lateral bodies 413 and aligned with and face the sliding slots 414 in the central body 411. Each of the connecting plates 412 has a first surface (412*a*) and a second surface (412*b*) opposite to the first surface (412*a*) in an up-down direction (D3) that is transverse to both the front-rear direction (D1) and the left-right direction (D2). The stop members 42 extend in the up-down direction (D3) and are respectively inserted into the sliding slots 414 at distal ends thereof away from the connecting plates 412. Each wear-resistant sheet 43 is securely disposed on the second surface (412*b*) of the respective connecting plate 412 through two studs, and has a curved surface which is engaged with the respective flexible circuit board 3 so as to reduce the frictional force therebetween for reducing damage to the flexible circuit board 3. The cushion pads 44 may be in the form of sponges which are respectively disposed on the first surfaces (412*a*) of the connecting plates 412 to prevent wear on the flexible circuit boards 3.

The sliding unit 5 includes two sliding members 51 which are slidably disposed on the base seat 41 in the front-rear direction (D1) and which extend in the left-right direction (D2), and four spring members 52 which are disposed between the base seat 41 and the sliding members 51. Each sliding member 51 is interposed between the central body 411 and one of the lateral bodies 413. Each flexible circuit board 3 is folded to surround the first surface (412*a*), the respective sliding member 51 and the second surface (412*b*). Each sliding member 51 has a tense portion 511 which extends in the left-right direction (D2) to have left and right sides, two sliding portions 512 which are respectively connected with the left and right sides of the tense portion 511 and which are respectively and slidably engaged in the sliding slots 414, and two spring mounting portions 513 which respectively extend from the sliding portions 512 in the front-rear direction (D1) for ends of the spring members 52 to be sleeved therearound. The sliding portion 511 has an arcuate tense surface (511*a*) between the left and right sides and remote from the base seat 41 for engaging with the corresponding flexible circuit board 3 so as to reduce the friction therebetween. The sliding members 51 are distant from the connecting plates 412 by a distance that is more than 4 mm so as to ensure smooth movement of the sliding members 51 without interference with the connecting plates 412. The stop members 42 may be in the form of rivets which are respectively inserted in the distal ends of the central body 411 and the lateral bodies 413 to prevent removal of the sliding portions 512 of the sliding members 51 from the sliding slots 414. The spring members 52 are coil springs which are respectively received in the sliding slots 414 and respectively sleeved around the spring mounting portions 513 and connected with the sliding portions 512. The spring members 52 are disposed to urge the sliding members 51 to the corresponding flexible circuit boards 3.

With reference to FIG. 2 and FIGS. 5 to 7, when the second device part 2 is rotated from the folded position to the unfolded position while using the electronic device 100, a pulling force is applied to the flexible circuit boards 3 by the second device part 2 to move the tense surface (511*a*) of the sliding member 51 toward the base seat 41. At this time, the sliding member 51 is biased by the spring members 52 to engage with the flexible circuit boards 3 and to maintain tension of the flexible circuit boards 3. During the rotation of the second device part 2 from the unfolded position to the folded position, with the biasing action of the spring members 52, the sliding member 51 is moved away from the base seat 41 to smoothly bring the flexible circuit boards 3 to return back to their original position to prevent deformation of the flexible circuit boards 3. The flexible circuit tension keeping device 10 has a simple structure with less component parts and can maintain tension of the flexible circuit boards 3 during the rotation of the first and second device parts 1, 2. The flexible circuit tension keeping device 10 is also easy to assemble compared with the roller shade device of the prior art.

Figure 8:
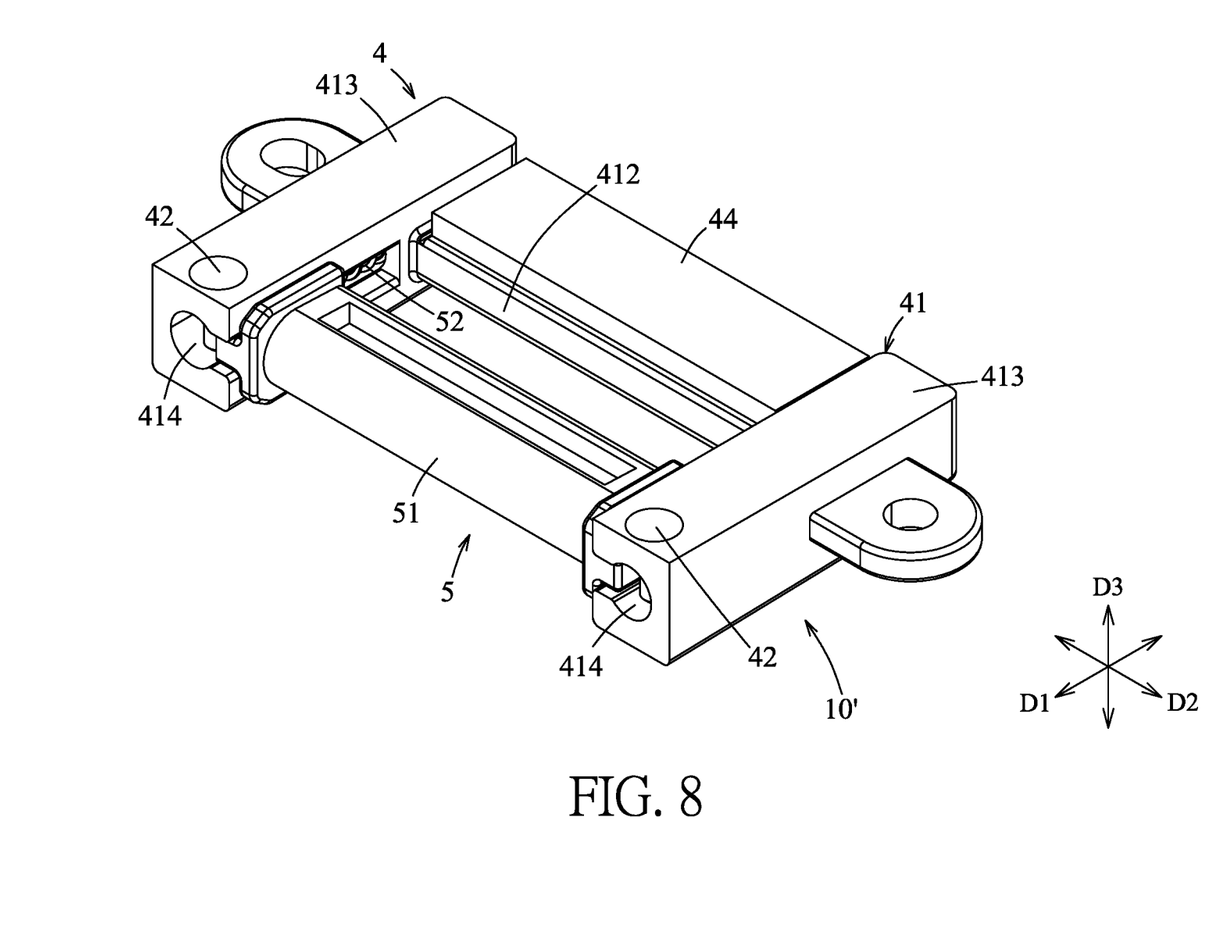
FIG. 8 is a perspective view illustrating another embodiment of a flexible circuit tension keeping device according to the disclosure.

With reference to FIG. 8, in another embodiment of the flexible circuit tension keeping device 10', the base seat 41 of the base seat unit 4 has two lateral bodies 413 and a connecting plate 412 interconnecting the lateral bodies 413. Two sliding slots 414 are respectively formed in the lateral bodies 413. Only one flexible circuit board 3 may be folded to surround the base seat 41.

As illustrated, with the sliding member 51 of the sliding unit 5 slidably disposed on the base seat 41, a pulling force generated as a result of rotation of the second device part 2 relative to the first device part 1 is applied to the flexible circuit board 3 to move the tense surface (511*a*) of the sliding member 51 toward the base seat 41, while the sliding member 51 is biased by the spring members 52 to engage with the flexible circuit board 3 so as to maintain tension of the flexible circuit board 3. Also, the flex circuit tension keeping device 10, 10' has a simple structure with less component parts and can maintain the tension of the flexible circuit board(s) 3 during the rotation of the first and second device parts 1, 2. The flexible circuit tension keeping device 10, 10' is also easy to assemble compared with the roller shade device of the prior art.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A flexible circuit tension keeping device mountable on an electronic device, the electronic device having a first device part, a second device part rotatably connected with the first device part, and at least one flexible circuit board extending between and interconnecting the first and second device parts, said flexible circuit tension keeping device comprising:
    a base seat unit including a base seat, said base seat having at least one first surface and at least one second surface opposite to said first surface such that the flexible circuit board is folded to surround said first surface and said second surface; and
    a sliding unit disposed on said base seat, and including at least one sliding member which is slidably disposed on said base seat in a front-rear direction and which extends in a left-right direction that is transverse to the front-rear direction, and at least two spring members which are disposed between said base seat and said sliding member, said sliding member having a tense surface which is disposed remote from said base seat and which is engaged with the flexible circuit board such that, a pulling force generated as a result of rotation of the second device part relative to the first device part is applied to the flexible circuit board to move said tense surface of said sliding member toward said base seat, and said sliding member is biased by said spring members to engage with the flexible circuit board and to maintain tension of the flexible circuit board.

2. The flexible circuit tension keeping device as claimed in claim 1, wherein said base seat has at least two sliding slots each extending in the front-rear direction, said sliding member having a tense portion which extends in the left-right direction to have left and right sides, and which has said tense surface between said left and right sides for engaging with the flexible circuit board, and two sliding portions which are respectively connected with said left and right sides of said tense portion and which are respectively and slidably engaged in said sliding slots, said spring members being respectively received in said sliding slots and respectively connected with said sliding portions.

3. The flexible circuit tension keeping device as claimed in claim 2, wherein said base seat has a central body, two connecting plates extending from said central body in the left-right direction and away from each other, and two lateral bodies respectively connected with said connecting plates to be disposed laterally of and spaced apart from said central body, said base seat having four of said sliding slots, two of said sliding slots being respectively formed in said lateral bodies, two other ones of said sliding slots being formed in said central body and spaced apart from each other, each of said connecting plates having said first surface and said second surface opposite to each other in an up-down direction, said sliding unit including two of said sliding members, each of which is interposed between said central body and one of said lateral bodies, and four of said spring members which are respectively received in said sliding slots such that each of two of the flexible circuit boards is adapted to surround said first and second surfaces of a respective one of said connecting plates and said tense surface of a respective one of said sliding members.

4. The flexible circuit tension keeping device as claimed in claim 2, wherein said base seat unit further includes at least two stop members which extend in an up-down direction and which are respectively inserted into said sliding slots at distal ends thereof to prevent removal of said sliding portions of said sliding members from said sliding slots.

5. The flexible circuit tension keeping device as claimed in claim 2, wherein said base seat unit further includes at least one wear-resistant sheet which is disposed on said second surface and engaged with the flexible circuit board.

6. The flexible circuit tension keeping device as claimed in claim 2, wherein said base seat unit further includes at least one cushion pad which is disposed on said first surface and in contact with the flexible circuit board.

7. The flexible circuit tension keeping device as claimed in claim 2, wherein said sliding member has two spring mounting portions which respectively extend from said sliding portions in the front-rear direction for an end of a respective one of said spring members to be sleeved therearound.

8. An electronic device comprising:
    a first device part;
    a second device part rotatably connected with said first device part;
    at least one flexible circuit board extending between and interconnecting said first and second device parts; and
    a flexible circuit tension keeping device including a base seat unit and a sliding unit, said base seat unit including a base seat which has at least one first surface and at least one second surface opposite to said first surface, said flexible circuit board being bent to surround said first surface and said second surface, said sliding unit being disposed on said base seat, said sliding unit including at least one sliding member which is slidably disposed on said base seat in a front-rear direction and which extends in a left-right direction that is transverse to the front-rear direction, and at least two spring members which are disposed between said base seat and said sliding member, said sliding member having a tense surface which is disposed remote from said base seat and which is engaged with said flexible circuit board such that, a pulling force generated as a result of rotation of said second device part relative to said first device part is applied to said flexible circuit board to move said tense surface of said sliding member toward said base seat, and said sliding member is biased by said spring members to engage with said flexible circuit board and to keep tense of said flexible circuit board.

9. The electronic device as claimed in claim 8, wherein said base seat has at least two sliding slots each extending in the front-rear direction, said sliding member having a tense portion which extends in the left-right direction to have left and right sides, and which has said tense surface between said left and right sides for engaging with said flexible circuit board, and two sliding portions which are respectively connected with said left and right sides of said tense portion and which are respectively and slidably engaged in said sliding slots, said spring members being respectively received in said sliding slots and respectively connected with said sliding portions.

10. The electronic device as claimed in claim 9, wherein said base seat has a central body, two connecting plates extending from said central body in the left-right direction and away from each other, and two lateral bodies respectively connected with said connecting plates to be disposed laterally of and spaced apart from said central body, said base seat having four of said sliding slots, two of said sliding slots being respectively formed in said lateral bodies, two other ones of said sliding slots being formed in said central body and spaced apart from each other, each of said connecting plates having said first surface and said second surface opposite to each other in an up-down direction, said sliding unit including two of said sliding members, each of which is interposed between said central body and one of said lateral bodies, and four of said spring members which are respectively received in said sliding slots, said electronic device comprising two of said flexible circuit boards, each of said flexible circuit boards surrounding said first and second surfaces of a respective one of said connecting plates and said tense surface of a respective one of said sliding members.

11. The electronic device as claimed in claim 9, wherein said base seat unit further includes at least two stop members which extend in an up-down direction and which are respectively inserted into said sliding slots at distal ends thereof to prevent removal of said sliding portions of said sliding members from said sliding slots.

12. The electronic device as claimed in claim 9, wherein said base seat unit further includes at least one wear-resistant sheet which is disposed on said second surface and engaged with said flexible circuit board.

13. The electronic device as claimed in claim 9, wherein said base seat unit further includes at least one cushion pad which is disposed on said first surface and in contact with said flexible circuit board.

14. The electronic device as claimed in claim 9, wherein said sliding member has two spring mounting portions which respectively extend from said sliding portions in the front-rear direction for an end of a respective one of said spring members to be sleeved therearound.

* * * * *